(12) United States Patent
Choe et al.

(10) Patent No.: US 6,614,264 B2
(45) Date of Patent: Sep. 2, 2003

(54) METHOD FOR INCREASING THE LOAD CAPACITY OF FULL-RAIL DIFFERENTIAL LOGIC

(75) Inventors: Swee Yew Choe, Milpitas, CA (US); Edgardo Klass, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/060,566

(22) Filed: Jan. 29, 2002

(65) Prior Publication Data

US 2003/0141902 A1 Jul. 31, 2003

(51) Int. Cl.[7] ............... H03K 19/096; H03K 19/094
(52) U.S. Cl. ..................... 326/95; 326/121; 326/113
(58) Field of Search ..................... 326/113, 95, 98, 326/121; 327/56, 67, 218, 219, 223

(56) References Cited

U.S. PATENT DOCUMENTS

| | | | |
|---|---|---|---|
| 4,247,791 A | 1/1981 | Rovell | 307/238 |
| 5,859,548 A | 1/1999 | Kong | 326/113 |
| 6,211,704 B1 * | 4/2001 | Kong | 326/121 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, Mar. 2, 2000 vol. 36 No.5, Mar. 2, 2000, pp. 404 to 405.

Kong et al., "Charge Recycling Differential Logic for Low-Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

* cited by examiner

*Primary Examiner*—Daniel Chang
(74) *Attorney, Agent, or Firm*—Gunnison, McKay & Hodgson, L.L.P.; Philip J. McKay

(57) ABSTRACT

Modified full-rail differential logic circuits are activated by a delayed clock and include a sense amplifier circuit that is triggered by a second delayed clock. The addition of the sense amplifier circuit, and second delayed clock signal allows the sense amplifier circuit to act as the driver and therefore there is no need for increasing the size of the differential logic network to provide a driver function. Consequently, the modified full-rail differential logic circuits of the invention are capable of operating efficiently under heavy load conditions without the increased size and the significant reduction in speed associated with prior art full-rail differential logic circuits.

16 Claims, 4 Drawing Sheets

METHOD FOR INCREASING THE LOAD CAPACITY OF FULL-RAIL DIFFERENTIAL LOGIC

FIELD OF THE INVENTION

The present invention relates generally to logic circuits and, more particularly, to full-rail differential logic circuits.

BACKGROUND OF THE INVENTION

One example of a prior art full-rail differential logic circuit is presented and discussed at page 112, and shown in FIG. 3(c), in "HIGH SPEED CMOS DESIGN STYLES" by Bernstein et al. of IBM Microelectronics; Kluwer Academic Publishers, 101 Philip Drive, Assinippi Park, Norwell, Mass., 02061; ISBN 0-7923-8220-X, hereinafter referred to as the Bernstein et al. reference, which is incorporated herein by reference, in its entirety, for all purposes.

FIG. 1 shows a prior art full-rail differential logic circuit 100 similar to that discussed in the Bernstein et al. reference. As seen in FIG. 1, prior art full-rail differential logic circuit 100 included six transistors: PFET 105, PFET 107, NFET 109, PFET 115, PFET 117 and NFET 121. Prior art full-rail differential logic circuit 100 also included: differential logic 123 with inputs 151 and 153; out terminal 111; and outBar terminal 113. Prior art full-rail differential logic circuit 100 is activated from a delayed clock signal CLKA. As shown in FIG. 1, signal CLKA was supplied to: gate 116 of PFET 115; gate 118 of PFET 117; gate 129 of NFET 109; and gate 122 of NFET 121.

Prior art full-rail differential logic circuit 100 worked reasonably well under conditions of a light load, for instance under conditions where fan out is less than four. However, prior art full-rail differential logic circuit 100 was less useful under conditions of a heavy load, for instance, in cases where fan out exceeded four. The shortcomings of prior art full-rail differential logic circuit 100 arose primarily because under heavy load conditions logic network 123 had to be increased in size to act as a driver for the next stage in the cascade. This in turn meant that logic network 123 was large, slow and inefficient. The problem was further aggravated as additional prior art full-rail differential logic circuits 100 were cascaded together to form the chains commonly used in the industry. Consequently, the full potential of prior art full-rail differential logic circuits 100 was not realized and their use was narrowly limited to light load applications.

What is needed is a method and apparatus for creating full-rail differential logic circuits that are capable of efficient use under heavy loads and are therefore more flexible, more space efficient and more reliable than prior art full-rail differential logic circuits.

SUMMARY OF THE INVENTION

The modified full-rail differential logic circuits of the invention include a sense amplifier circuit that is triggered by the delayed clock of the following stage, i.e., the clock input to the sense amplifier circuit of the modified full-rail differential logic circuits of the invention is additionally delayed with respect to the delayed clock that drives the full-rail differential logic. The addition of the sense amplifier circuit, and second delayed clock signal, according to the invention, allows the sense amplifier circuit to act as the driver and therefore there is no need for increasing the size of the logic network to provide the driver function. Consequently, the modified full-rail differential logic circuits of the invention are capable of operating efficiently under heavy load conditions without the increased size and the significant reduction in speed associated with prior art full-rail differential logic circuits. In addition, the modified full-rail differential logic circuits of the invention require less space, are simpler, dissipate less heat and have fewer components to potentially fail.

The modified full-rail differential logic circuits of the invention can be cascaded together to form the chains commonly used in the industry. When the modified full-rail differential logic circuits of the invention are cascaded together, the advantages of the modified full-rail differential logic circuits of the invention are particularly evident and the gains in terms of efficiency, size reduction and flexibility are further pronounced.

In particular, one embodiment of the invention is a cascaded chain of modified full-rail differential logic circuits. The chain includes a first modified full-rail differential logic circuit. The first modified full-rail differential logic circuit includes: a first modified full-rail differential logic circuit first clock input terminal; at least one first modified full-rail differential logic circuit data input terminal; at least one first modified full-rail differential logic circuit data output terminal; and a first modified full-rail differential logic circuit second clock input terminal.

The cascaded chain of the invention also includes a second modified full-rail differential logic circuit. The second modified full-rail differential logic circuit includes: a second modified full-rail differential logic circuit first clock input terminal; at least one second modified full-rail differential logic circuit data input terminal; at least one second modified full-rail differential logic circuit data output terminal; and a second modified full-rail differential logic circuit second clock input terminal.

According to the invention, the at least one first modified full-rail differential logic circuit data output terminal is coupled to the at least one second modified full-rail differential logic circuit data input terminal to form the chain. According to the invention, a first clock signal is coupled to the first modified full-rail differential logic circuit first clock input terminal and a second clock signal is coupled to the first modified full-rail differential logic circuit second clock input terminal and the second modified full-rail differential logic circuit first clock input terminal. According to the invention, the second clock signal is delayed with respect to the first clock signal by a predetermined delay time.

In one embodiment of the invention, a delay circuit is coupled between the first modified full-rail differential logic circuit clock input terminal and the second modified full-rail differential logic circuit first clock input terminal to provide the predetermined delay time. In one embodiment of the invention, the delay circuit is also coupled between the first modified full-rail differential logic circuit clock input terminal and the first modified full-rail differential logic circuit second clock input terminal to provide the predetermined delay time.

One embodiment of the invention is a modified full-rail differential logic circuit that includes a modified full-rail differential logic circuit out terminal and a modified full-rail differential logic circuit outBar terminal.

In one embodiment of the invention, the modified full-rail differential logic circuit also includes a first node, the first node is coupled to a first supply voltage.

In one embodiment of the invention, the modified full-rail differential logic circuit also includes a first transistor, the first transistor including a first transistor first flow electrode, a first transistor second flow electrode and a first transistor control electrode. The first node is coupled to the first transistor first flow electrode and the first transistor second flow electrode is coupled to the modified full-rail differential logic circuit out terminal. The first transistor can also include a back bias input terminal having a back bias voltage thereon.

In one embodiment of the invention, the modified full-rail differential logic circuit also includes a second transistor, the second transistor including a second transistor first flow electrode, a second transistor second flow electrode and a second transistor control electrode. The first node is coupled to the second transistor first flow electrode and the second transistor second flow electrode is coupled to the modified full-rail differential logic circuit outBar terminal.

In one embodiment of the invention, the modified full-rail differential logic circuit also includes a third transistor, the third transistor including a third transistor first flow electrode, a third transistor second flow electrode and a third transistor control electrode. The first transistor control electrode is coupled to the third transistor first flow electrode and the modified full-rail differential logic circuit outBar terminal. The second transistor control electrode is coupled to the third transistor second flow electrode and the modified full-rail differential logic circuit out terminal. The third transistor control electrode is coupled to a clock signal CLKA.

In one embodiment of the invention, the modified full-rail differential logic circuit also includes a fourth transistor, the fourth transistor including a fourth transistor first flow electrode, a fourth transistor second flow electrode and a fourth transistor control electrode. The first node is coupled to the fourth transistor first flow electrode and the fourth transistor second flow electrode is coupled to the modified full-rail differential logic circuit out terminal. The fourth transistor control electrode is coupled to the clock signal CLKA. The fourth transistor can also include a back bias input terminal having a back bias voltage thereon.

In one embodiment of the invention, the modified full-rail differential logic circuit also includes a fifth transistor, the fifth transistor including a fifth transistor first flow electrode, a fifth transistor second flow electrode and a fifth transistor control electrode. The first node is coupled to the fifth transistor first flow electrode and the fifth transistor second flow electrode is coupled to the modified full-rail differential logic circuit outBar terminal. The fifth transistor control electrode is coupled to the clock signal CLKA. The fifth transistor can also include a back bias input terminal having a back bias voltage thereon.

In one embodiment of the invention, the modified full-rail differential logic circuit also includes a sense amplifier circuit coupled between the modified full-rail differential logic circuit out terminal and the modified full-rail differential logic circuit outBar terminal.

In one embodiment of the invention, the modified full-rail differential logic circuit sense amplifier circuit includes a sixth transistor, the sixth transistor including a sixth transistor first flow electrode, a sixth transistor second flow electrode and a sixth transistor control electrode. The first transistor second flow electrode is coupled to the sixth transistor first flow electrode. The sixth transistor second flow electrode is coupled to a second node. The sixth transistor control electrode is coupled to the third transistor first flow electrode and the modified full-rail differential logic circuit outbar terminal.

In one embodiment of the invention, the modified full-rail differential logic circuit sense amplifier circuit also includes a seventh transistor, the seventh transistor including a seventh transistor first flow electrode, a seventh transistor second flow electrode and a seventh transistor control electrode. The second transistor second flow electrode is coupled to the seventh transistor first flow electrode. The seventh transistor second flow electrode is coupled to the second node. The seventh transistor control electrode is coupled to the third transistor second flow electrode and the modified full-rail differential logic circuit out terminal.

In one embodiment of the invention, the modified full-rail differential logic circuit sense amplifier circuit also includes an eighth transistor, the eighth transistor including an eighth transistor first flow electrode, an eighth transistor second flow electrode and an eighth transistor control electrode. The eighth transistor first flow electrode is coupled to the second node and the eighth transistor second flow electrode is coupled to a second supply voltage. A clock signal CLKB is coupled to the eighth transistor control electrode of the modified full-rail differential logic circuit sense amplifier circuit. In one embodiment of the invention, the clock signal CLKB is delayed a predetermined time with respect to the clock signal CLKA.

In one embodiment of the invention, the modified full-rail differential logic circuit also includes a logic block, the logic block including at least one logic block input terminal, a logic block out terminal and a logic block outBar terminal. The logic block out terminal is coupled to the modified full-rail differential logic circuit out terminal and the logic block outBar terminal is coupled to the modified full-rail differential logic circuit outBar terminal.

In one embodiment of the invention, the modified full-rail differential logic circuit also includes a ninth transistor, the ninth transistor including a ninth transistor first flow electrode, a ninth transistor second flow electrode and a ninth transistor control electrode. The ninth transistor first flow electrode is coupled to the logic block. The ninth transistor control electrode is coupled to the clock signal CLKA. The ninth transistor second flow electrode is coupled to the second supply voltage.

As discussed in more detail below, the modified full-rail differential logic circuits of the invention are capable of efficient use under heavy loads and are therefore more flexible, more space efficient and more reliable than prior art full-rail differential logic circuits.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

The modified full-rail differential logic circuits (200 in FIG. 2 and 300A, 300B, 300C and 300N in FIG. 3) of the invention include a sense amplifier circuit (280 in FIG. 2) that is triggered by the delayed clock (CLKB in FIG. 2 and FIG. 3 and CLKC, CLKD, CLKN+1 in FIG. 3) of the following stage, i.e., the clock input to the sense amplifier circuit of the modified full-rail differential logic circuits of the invention is additionally delayed with respect to the delayed clock that drives the full-rail differential logic. The addition of the sense amplifier circuit and second delayed clock signal, according to the invention, allows the sense amplifier circuit to act as the driver and therefore there is no need for increasing the size of the logic network (123 in FIG. 2) to provide the driver function. Consequently, the modified full-rail differential logic circuits of the invention are capable of operating efficiently under heavy load conditions without the significant reduction in speed associated with prior art full-rail differential logic circuits. In addition, the modified full-rail differential logic circuits of the invention require less space, are simpler, dissipate less heat and have fewer components to potentially fail.

The modified full-rail differential logic circuits of the invention can be cascaded together to form the chains (301 in FIG. 3) commonly used in the industry. When the modified full-rail differential logic circuits of the invention are cascaded together, the advantages of the modified full-rail differential logic circuits of the invention are particularly evident and the gains in terms of efficiency, size reduction and flexibility are further pronounced.

Figure 1:
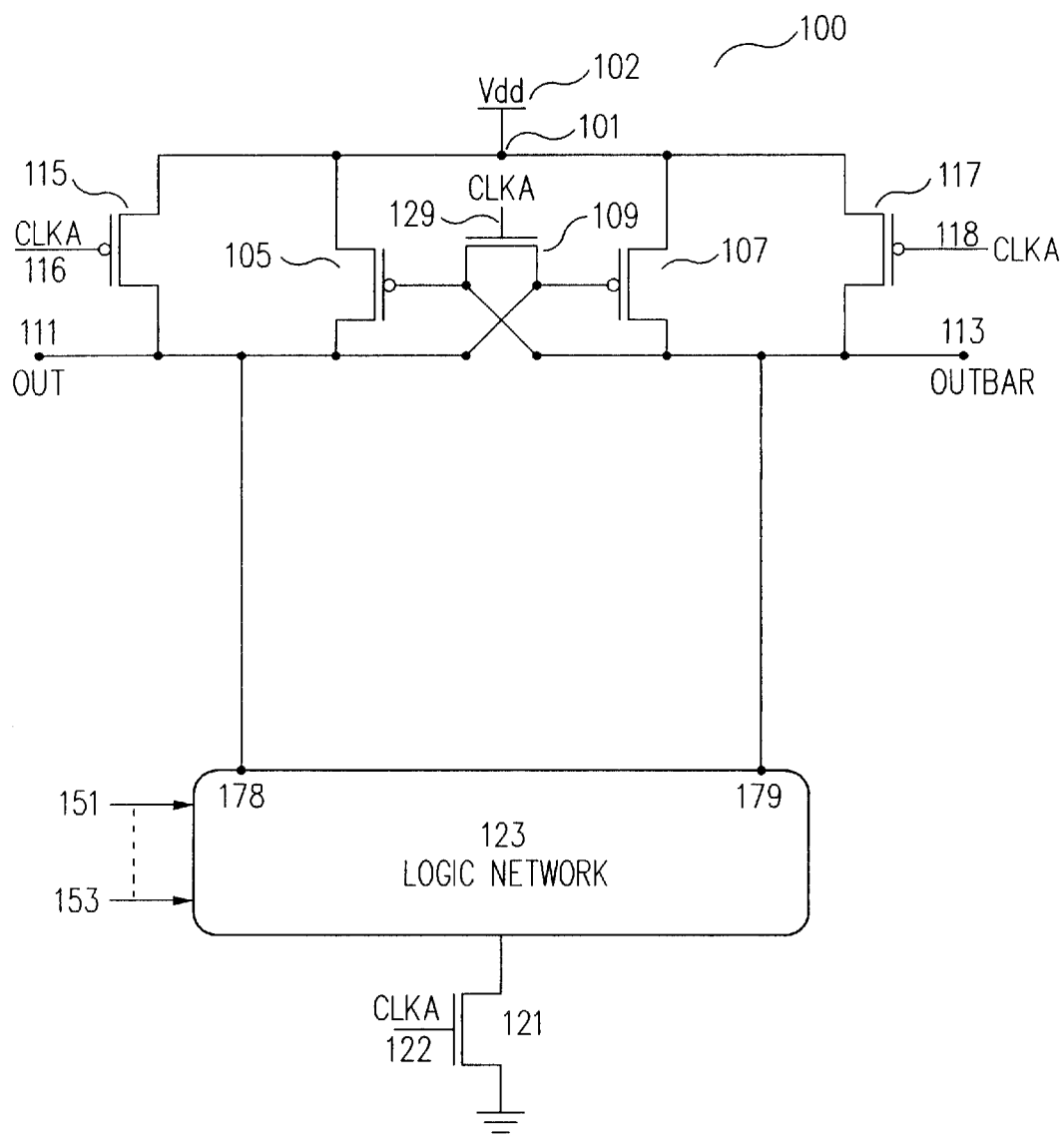
FIG. 1 shows a schematic diagram of a prior art full-rail differential logic.
Figure 2:
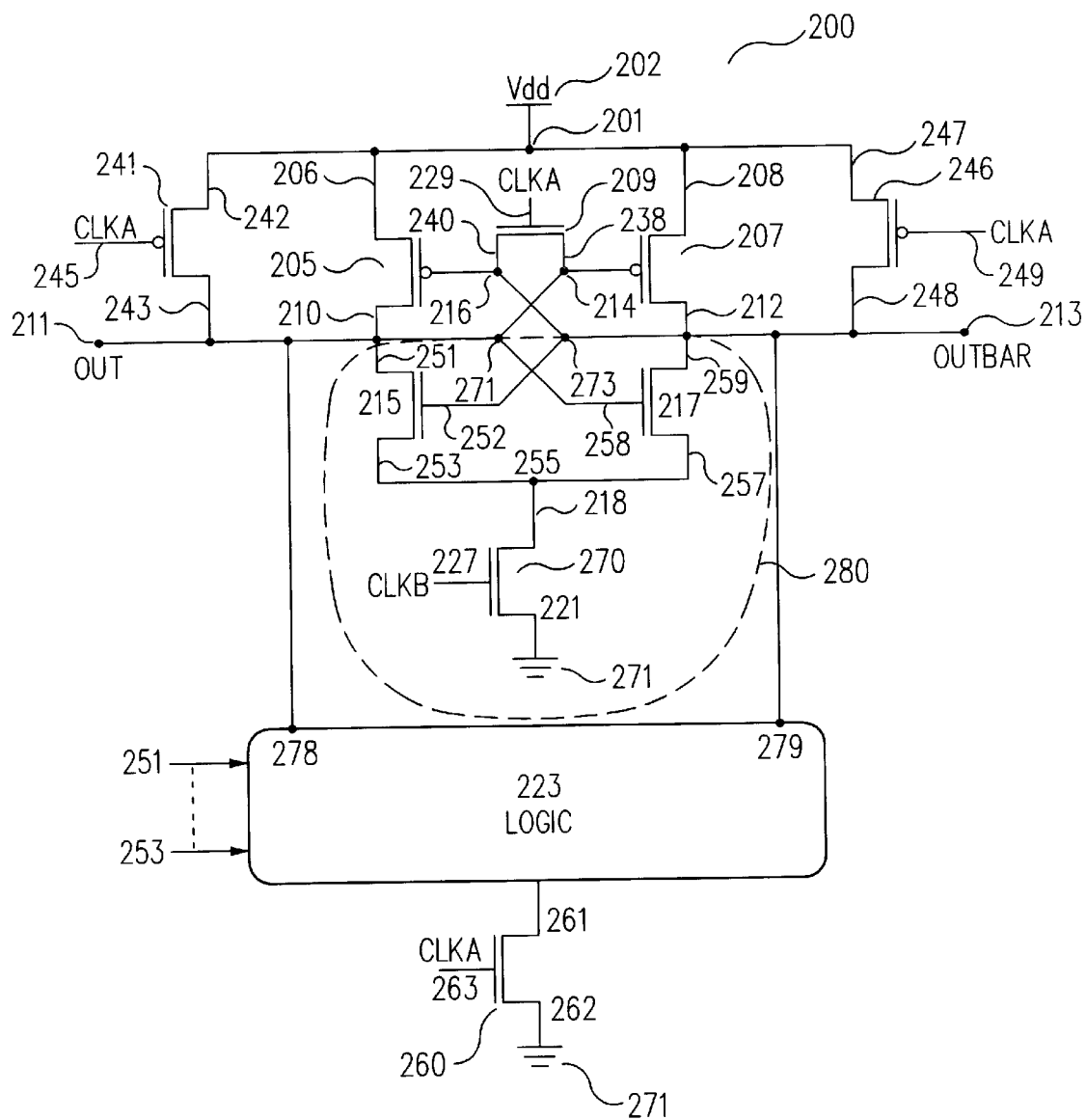
FIG. 2 shows a schematic diagram of one embodiment of a modified full-rail differential logic circuit designed according to the principles of the present invention.

FIG. 2 shows a schematic diagram of one embodiment of a modified full-rail differential logic circuit 200 designed according to the principles of the present invention. As seen in FIG. 2, modified full-rail differential logic circuit 200 includes a first supply voltage 202 coupled to a first node 201. First node 201 is coupled to: a source 206 of a first transistor, PFET 205; a source 208 of a second transistor, PFET 207; a source 242 of a fourth transistor, PFET 241 and a source 247 of a fifth transistor, PFET 246. The clock signal CLKA is coupled to: a control electrode or gate 245 of PFET 241; a control electrode or gate 249 of PFET 246; a control electrode or gate 229 of a third transistor, NFET 209; a control electrode or gate 263 of a ninth transistor, NFET 260.

A control electrode or gate 216 of PFET 205 is coupled to a source 240 of NFET 209 and an outBar terminal 213. A control electrode or gate 214 of PFET 207 is coupled to a drain 238 of NFET 209 and an out terminal 211. A drain 210 of PFET 205 is coupled to out terminal 211 and a drain 212 of PFET 207 is coupled to outBar terminal 213.

As discussed above, gate 245 of PFET 241 is coupled to clock signal CLKA, as is gate 249 of PFET 246. A drain 243 of PFET 241 is coupled to out terminal 211 and a drain 248, of PFET 249 is coupled to outBar terminal 213.

According to the invention, modified full-rail differential logic circuit 200 also includes sense amplifier circuit 280. In one embodiment of the invention, sense amplifier circuit 280 includes a sixth transistor, NFET 215 including a drain 251, a source 253 and a control electrode or gate 252. Drain 210 of PFET 205 is coupled to drain 251 of NFET 215. Source 253 of NFET 215 is coupled to a second node 255. Gate 252 of NFET 215 is coupled to source 240 of NFET 209 and modified full-rail differential logic circuit outBar terminal 213.

In one embodiment of the invention, sense amplifier circuit 280 also includes a seventh transistor, NFET 217 including a drain 259, a source 257 and a control electrode or gate 258. Drain 212 of PFET 207 is coupled to drain 259 of NFET 217. Source 257 of NFET 217 is coupled to a second node 255. Gate 258 of NFET 217 is coupled to drain 238 of NFET 209 and modified full-rail differential logic circuit out terminal 211.

In one embodiment of the invention, sense amplifier circuit 280 of modified full-rail differential logic circuit 200 also includes an eighth transistor, NFET 270, including a drain 218, a source 221 and a control electrode or gate 227. Drain 218 of NFET 270 is coupled to second node 255. Source 271 of NFET 270 is coupled to a second supply voltage 271. A delayed clock signal CLKB is coupled to control electrode or gate 227 of NFET 270. According to one embodiment of the invention, clock signal CLKB is delayed with respect to clock signal CLKA by a predetermined time.

In one embodiment of the invention, the modified full-rail differential logic circuit also includes a logic block 223. In one embodiment of the invention, logic block 223 is an NMOS pass transistor logic network including input terminals 251 and 253. A logic block out terminal 278 is coupled to out terminal 211 and a logic block outBar terminal 279 is coupled to outBar terminal 213. In other embodiments of the invention, logic block 223 includes any type of differential logic and/or circuitry used in the art including various logic gates, logic devices and circuits.

A particular embodiment of a modified full-rail differential logic circuit 200 according to the invention is shown in FIG. 2. Those of skill in the art will recognize that modified full-rail differential logic circuit 200 can be easily modified. For example, different transistors, i.e., PFETs 205, 207, 241, and 246 or NFETs 209, 215, 217, 260 and 270 can be used. In particular, the NFETs and PFETS shown in FIG. 2 can be readily exchanged for PFETs and NFETs by reversing the polarities of the supply voltages 202 and 271, or by other well known circuit modifications. Consequently, the modified full-rail differential logic circuit 200 that is shown in FIG. 2 is simply one embodiment of the invention used for illustrative purposes only and does not limit the present invention to that one embodiment of the invention.

As discussed above, modified full-rail differential logic circuit 200 of the invention includes sense amplifier circuit 280 that is triggered by delayed clock signal CLKB of the following stage, i.e., the clock signal CLKB to gate 227 of NFET 270 of sense amplifier circuit 280 is additionally delayed with respect to the delayed clock signal CLKA. Clock signal CLKA is coupled to: gate 245 of PFET 241; gate 229 of NFET 209; gate 249 of PFET 246 and gate 263 of NFET 260. The addition of sense amplifier circuit 280 and second delayed clock signal CLKB, according to the invention, allows sense amplifier circuit 280 to act as the driver and therefore there is no need for increasing the size of the logic block 223 to provide the driver function. Consequently, modified full-rail differential logic circuit 200 of the invention is capable of operating efficiently under heavy load conditions without the significant reduction in speed associated with prior art full-rail differential logic circuits 100. In addition, modified full-rail differential logic circuit 200 requires less space, is simpler, dissipates less heat and has fewer components to potentially fail.

As also discussed above, modified full-rail differential logic circuit 200 can be cascaded together with other modified full-rail differential logic circuits 200 to form the chains commonly used in the industry. When modified full-rail differential logic circuits 200 of the invention are cascaded together, the advantages of modified full-rail differential logic circuit 200 is particularly evident and the gains in terms of efficiency, size reduction and flexibility are further pronounced.

When modified full-rail differential logic circuits 200 of the invention are cascaded together, the delayed clock signal CLKA is, according to the invention, timed to be at least the delay of the previous modified full-rail differential logic circuit 200 (not shown) to ensure each modified full-rail differential logic circuit 200 of the invention is switched or "fired" only after it has received an input from the previous modified full-rail differential logic circuit 200.

Figure 3:
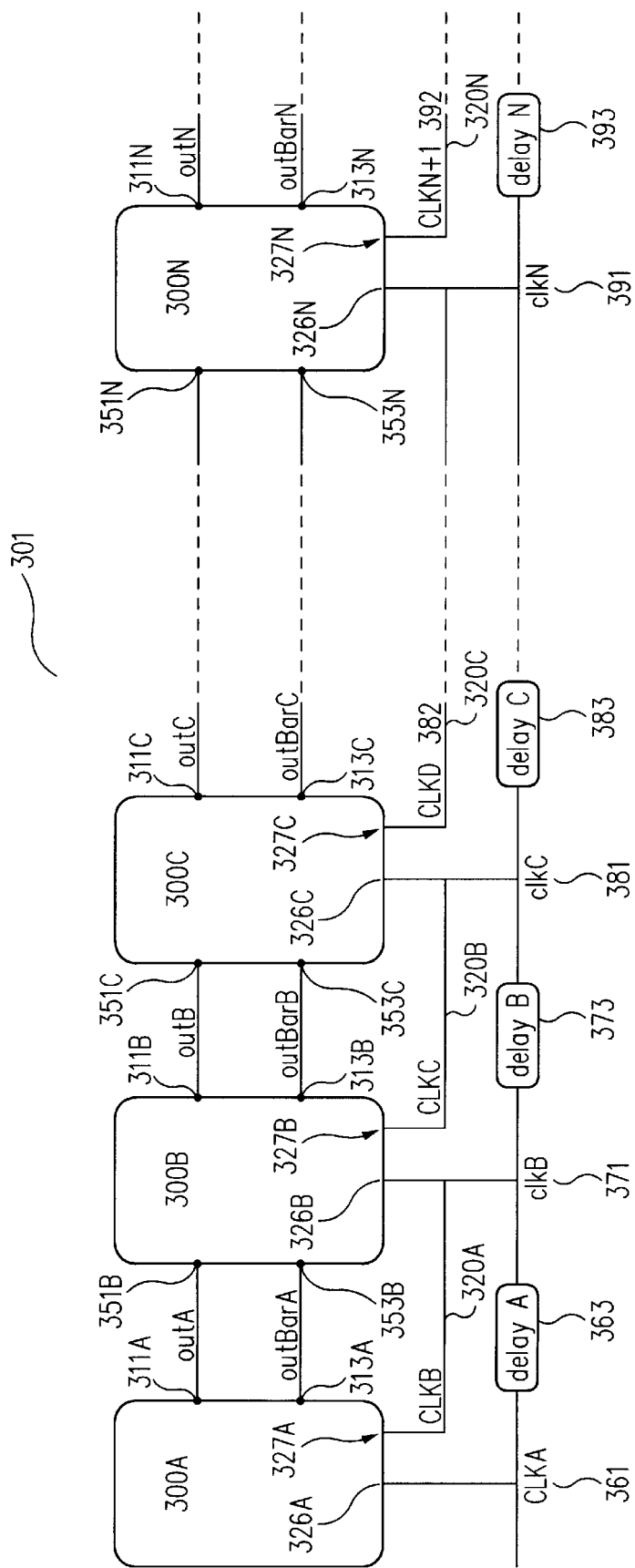
FIG. 3 shows one embodiment of a cascaded chain of modified full-rail differential logic circuits according to the principles of the present invention.

FIG. 3 shows one embodiment of a cascaded chain 301 of modified full-rail differential logic circuits 300A, 300B, 300C and 300N of the present invention. Each modified full-rail differential logic circuit 300A, 300B, 300C and 300N represents a stage in cascaded chain 301. In one embodiment of the invention, each modified full-rail differential logic circuit 300A, 300B, 300C and 300N is similar to modified full-rail differential logic circuit 200 discussed above with respect to FIG. 2.

As seen in FIG. 3, modified full-rail differential logic circuit 300A includes: a first clock input terminal 326A; a second clock input terminal 327A; an out terminal 311A; and an outBar terminal 313A.

Modified full-rail differential logic circuit 300B includes: a first clock input terminal 326B; a second clock input terminal 327B; an input terminal 351B, coupled to out terminal 311A of modified full-rail differential logic circuit 300A; an inputBar terminal 353B, coupled to outBar terminal 313A of modified full-rail differential logic circuit 300A; an output terminal 311B; and an outBar terminal 313B. Likewise, modified full-rail differential logic circuit 300C includes: a first clock input terminal 326C; a second clock input terminal 327C; an input terminal 351C, coupled to output terminal 311B of modified full-rail differential logic circuit 300B; an inputBar terminal 353C, coupled to outBar terminal 313B of modified full-rail differential logic circuit 300B; an output terminal 311C; and an outBar terminal 313C.

Modified full-rail differential logic circuit 300N includes: a first clock input terminal 326N; a second clock input terminal 327N; an input terminal 351N, coupled to an output terminal 311N−1 (not shown) of a modified full-rail differential logic circuit 300N−1 (not shown); an inputBar terminal 353N, coupled to an outBar terminal 313N−1 (not shown) of a modified full-rail differential logic circuit 300N−1 (not shown); an output terminal 311N; and an outBar terminal 313N.

According to the invention, any number of modified full-rail differential logic circuits 300A, 300B, 300C and 300N can be employed with cascaded chain 301. As also shown in FIG. 3, and discussed above, output terminal 311A of modified full-rail differential logic circuit 300A couples signal OUTA to input terminal 351B of modified full-rail differential logic circuit 300B and outBar terminal 313A of modified full-rail differential logic circuit 300A couples signal OUTBARA to inputBar terminal 353B of modified full-rail differential logic circuit 300B. Likewise, output terminal 311B of modified full-rail differential logic circuit 300B couples signal OUTB to input terminal 351C of modified full-rail differential logic circuit 300C and outBar terminal 313B of modified full-rail differential logic circuit 300B couples signal OUTBARB to inputBar terminal 353C of modified full-rail differential logic circuit 300C. In addition, output terminal 311N of modified full-rail differential logic circuit 300N couples signal OUTN to an input terminal 351N+1 (not shown) of a modified full-rail differential logic circuit 300N+1 (not shown) and outBar terminal 313N of modified full-rail differential logic circuit 300N couples signal OUTBARN to an inputBar terminal 353N+1 (not shown) of a modified full-rail differential logic circuit 300N+1 (not shown).

According to the invention, each modified full-rail differential logic circuit 300A, 300B, 300C and 300N of cascaded chain 301 receives its own delayed first clock signal CLKA 361, CLKB 371, CLKC 381 and CLKN 391, respectively. According to the invention clock signals CLKA 361, CLKB 371, CLKC 381 and CLKN 391 are provided to modified full-rail differential logic circuits 300A, 30013, 300C and 300N, respectively, by introducing delay circuits 363, 373, 383 and 393 between successive modified full-rail differential logic circuits 300A, 300B, 300C and 300N. Consequently, delay circuit 363 introduces a delay time between signal CLKA 361, coupled to first clock input terminal 326A of modified full-rail differential logic circuit 300A, and signal CLKB 371, coupled to first clock input terminal 326B of modified full-rail differential logic circuit 300D. Delay circuit 373 introduces a delay time between signal CLKB 371 and signal CLKC 381, coupled to first clock input terminal 326C of modified full-rail differential logic circuit 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to first clock input terminal 326N of modified full-rail differential logic circuit 300N, and a further delay circuit 393 introduces a further delay time between CLKN 391 and CLK N+1 (not shown) coupled to a first clock input terminal 326N+1 (not shown) of a modified full-rail differential logic circuit 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each modified full-rail differential logic circuit 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to modified full-rail differential logic circuit 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

In addition, according to the invention, each modified full-rail differential logic circuit 300A, 300B, 300C and 300N of cascaded chain 301 receives a second delayed clock signal at its second clock input terminal 327A, 327B, 327C and 327N, respectively. In one embodiment of the invention, the second delayed clock signal for a given modified full-rail differential logic circuit 300A, 300B, 300C and 300N of cascaded chain 301 is the delayed clock signal of the following modified full-rail differential logic circuit 300A, 300B, 300C and 300N in cascaded chain 301. In this embodiment of the invention, the second delayed clock signal for a given modified full-rail differential logic circuit 300A, 300B, 300C and 300N of cascaded chain 301 is provided by coupling the second clock terminal 327A, 327B, 327C and 327N of a given modified full-rail differential logic circuit 300A, 300B, 300C and 300N, respectively, to the first clock input terminal 326B, 326C, 326D (not shown), 326N and 326N+1 (not shown) of the following stage 300B, 300C, 300N and 300N+1 (not shown).

Thus, in FIG. 3, line 320A couples second clock input terminal 327A of modified full-rail differential logic circuit 300A to first clock input terminal 326B of modified full-rail differential logic circuit 300B and delay circuit 363 introduces a delay time between signal CLKA 361, coupled to first clock input terminal 326A of modified full-rail differential logic circuit 300A, and signal CLKB 371, coupled to second clock input terminal 327A of modified full-rail differential logic circuit 300A. Likewise, line 320B couples second clock input terminal 327B of modified full-rail differential logic circuit 300B to first clock input terminal 326C of modified full-rail differential logic circuit 300C and delay circuit 373 introduces a delay time between signal CLKB 371, coupled to first clock input terminal 326B of modified full-rail differential logic circuit 300B, and signal CLKC 381, coupled to second clock input terminal 327B of modified full-rail differential logic circuit 300B.

Similarly, line 320C couples second clock input terminal 327C of modified full-rail differential logic circuit 300C to first clock input terminal 326D (not shown) of a modified full-rail differential logic circuit 300D (not shown) and delay circuit 383 introduces a delay time between signal CLKC 381, coupled to first clock input terminal 326C of modified full-rail differential logic circuit 300C, and signal CLKD 382, coupled to second clock input terminal 327C of modified full-rail differential logic circuit 300C. Likewise, line 320N couples first clock input terminal 326N+1 (not shown) of a modified full-rail differential logic circuit 300N+1 (not shown) to second clock input terminal 327N of modified full-rail differential logic circuit 300N and delay circuit 393 introduces a delay time between signal CLKN 391, coupled to first clock input terminal 326N of modified full-rail differential logic circuit 300N, and signal CLKN+1 392, coupled to second clock input terminal 327N of modified full-rail differential logic circuit 300N.

In one embodiment of the invention, second clock input terminals 327A, 327B, 327C and 327N of modified full-rail differential logic circuits 300A, 300B, 300C and 300N, respectively, are coupled to a sense amplifiers (not shown in FIG. 3) in modified full-rail differential logic circuits 300A, 300B, 300C and 300N, such as sense amplifier circuit 280 in FIG. 2, and the signals CLKB, CLKC, CLKD, and CLKN+1 are used as described above with respect to FIG. 2 to trigger the sense amplifiers (not shown in FIG. 3) in modified full-rail differential logic circuits 300A, 300B, 300C and 300N.

Figure 4:
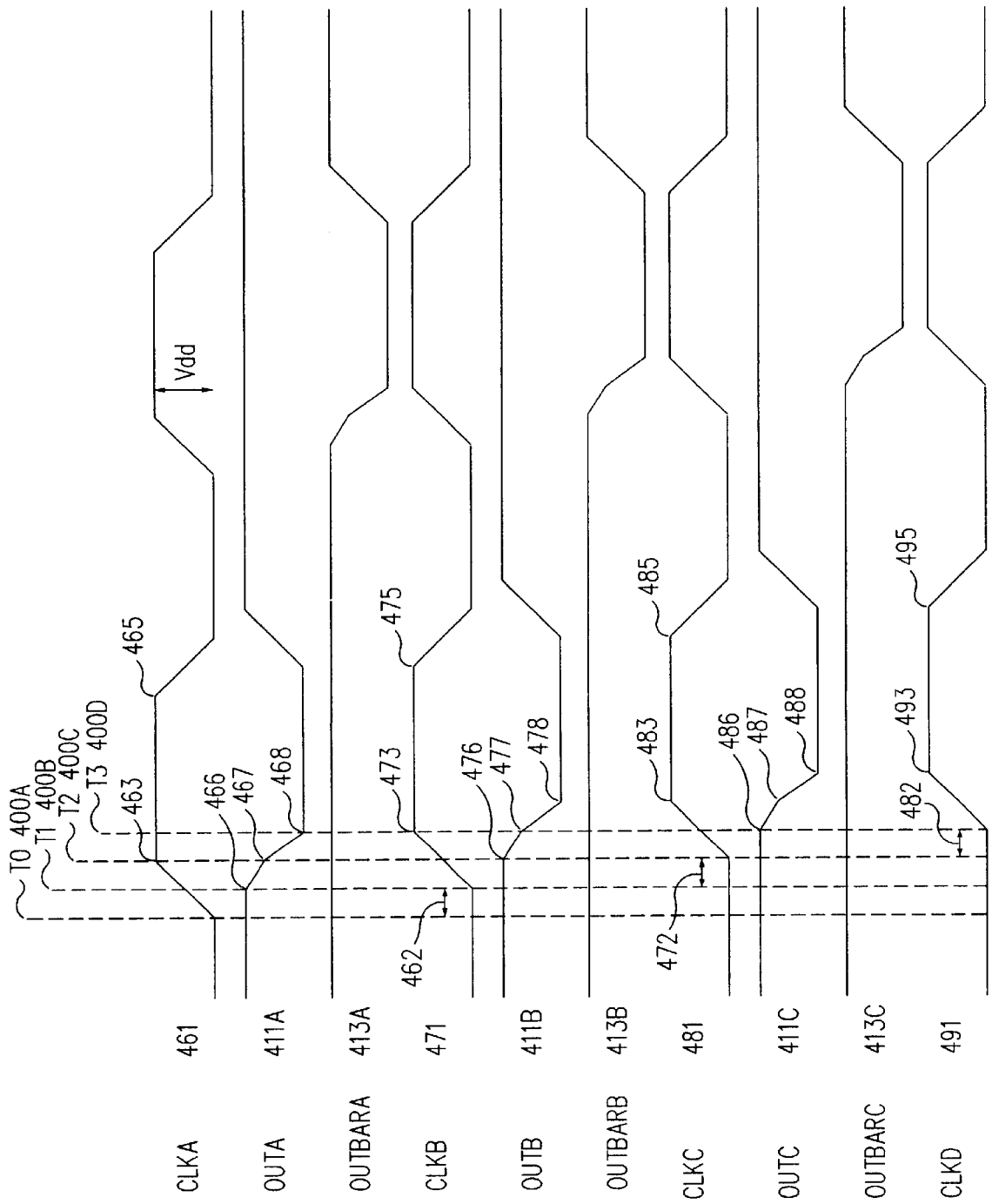
FIG. 4 is a one embodiment of a timing diagram for the cascaded chain of modified full-rail differential logic circuits of the invention shown in FIG. 3.

FIG. 4 is one embodiment of a timing diagram for cascaded chain 301 of modified full-rail differential logic circuits 300A, 300B, 300C, and 300N of FIG. 3. As seen in FIG. 3 and FIG. 4 together, according to one embodiment of the invention, at time T0, i.e., point T0 400A in FIG. 4: signal CLKA 461 begins to go high; OUTA 411A at out terminal 311A is high; OUTBARA 413A is high; CLKB 471 is low; OUTB 411B is high; OUTBARB 413B is high; CLKC 481 is low; OUTC is high; OUTBARC is high; and CLKD 491 is low.

A delay time 462 from point T0 400A and to point T1 400B is introduced by delay circuit 363. As discussed above, delay time 462 helps ensure modified full-rail differential logic circuit 300B receives signals OUTA and OUTBARA from modified full-rail differential logic circuit 300A before the switching of signal CLKB 471. As also discussed above, according to the invention, CLKB 471 also acts as the delayed clock signal to second clock input terminal 327A of modified full-rail differential logic circuit 300A to serve as a trigger for a sense amplifier circuit, such as sense amplifier circuit 280 of FIG. 2, that is used in modified full-rail differential logic circuit 300A.

At time T1, i.e., point T1 400B in FIG. 4: signal CLKA 461 continues to go high; OUTA 411A starts to slowly go low at point 466; signal OUTBARA at outBar terminal 313A remains high; CLKB 471 starts to go high; OUTB 411B remains high; OUTBARB 413B remains high; CLKC 481 remains low; OUTC remains high; OUTBARC remains high; and CLKD 491 remains low.

A delay time 472 from point T1 400B and to point T2 400C is introduced by delay circuit 373. As discussed above, delay time 472 helps ensure modified full-rail differential logic circuit 300C receives signals OUTB and OUTBARB from modified full-rail differential logic circuit 300B before the switching of signal CLKC 481. As also discussed above, according to the invention, CLKC 481 also acts as the delayed clock signal to second clock input terminal 327B of modified full-rail differential logic circuit 300B to serve as a trigger for a sense amplifier circuit, such as sense amplifier circuit 280 of FIG. 2, that is used in modified full-rail differential logic circuit 300B.

At time T2, i.e., point T2 400C in FIG. 4: signal CLKA 461 reaches high point 463; the sense amplifier, such as sense amplifier 280 in FIG. 2, which, according to the invention, is part of modified full-rail differential logic circuit 300A is activated and Output OUTA 411A pulls strongly low starting at point 467, note the difference in the slope of signal OUTA 411A between points 466 and 467, when the sense amplifier is not activated, and points 467 and 468, when the sense amplifier is activated; OUTBARA remains high; CLKB 471 continues to go high; OUTB 411B begins to slowly go low at point 476; OUTBARB 413B remains high; CLKC 481 starts to go high; OUTC remains high; OUTBARC remains high; and CLKD 491 remains low.

A delay time 482 from point T2 400C and to point T3 400D is introduced by delay circuit 383. As discussed above, delay time 482 helps ensure modified full-rail differential logic circuit 300D (not shown) receives signals OUTC and OUTBARC from modified full-rail differential logic circuit 300C before the switching of signal CLKD 491. As also discussed above, according to the invention, CLKC 491 also acts as the delayed clock signal to second clock input terminal 327C of modified full-rail differential logic circuit 300C to serve as a trigger for a sense amplifier circuit, such as sense amplifier circuit 280 of FIG. 2, that is used in modified full-rail differential logic circuit 300C.

At time T3, i.e., point T3 400D in FIG. 4: signal CLKA remains high; OUTA reaches low point 468; OUTBARA remains high; CLKB 471 reaches high point 473; the sense amplifier, such as sense amplifier 280 in FIG. 2, which, according to the invention, is part of modified full-rail differential logic circuit 300B is activated and Output OUTB 411B pulls strongly low starting at point 477, note the difference in the slope of signal OUTB 411B between points 476 and 477, when the sense amplifier is not activated, and points 477 and 478, when the sense amplifier is activated; CLKC 481 continues to go high; OUTC begins to slowly go low at point 486; OUTBARC remains high; and CLKD 491 begins to go high. As discussed above, according to the invention, any number of modified full-rail differential logic circuits 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As discussed above, modified full-rail differential logic circuits 200, 300A, 300B, 300C and 300N of the invention include sense amplifier circuit 280 that is triggered by the delayed clock of the following stage, i.e., the clock input to the sense amplifier circuit of the modified full-rail differential logic circuits of the invention is additionally delayed with respect to the delayed clock that drives the full-rail differential logic. The addition of the sense amplifier circuit, and second delayed clock signal, according to the invention, allows the sense amplifier circuit to act as the driver and therefore there is no need for increasing the size of the logic network to provide the driver function. Consequently, the modified full-rail differential logic circuits of the invention are capable of operating efficiently under heavy load conditions without the increased size and the significant reduction in speed associated with prior art full-rail differential logic circuits. In addition, the modified full-rail differential logic circuits of the invention require less space, are simpler, dissipate less heat and have fewer components to potentially fail.

As also discussed above, the modified full-rail differential logic circuits of the invention can be cascaded together to form the chains commonly used in the industry. When the modified full-rail differential logic circuits of the invention are cascaded together, the advantages of the modified full-rail differential logic circuits of the invention are particularly evident and the gains in terms of efficiency, size reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A method of cascading a chain of modified full-rail differential logic circuits comprising:
   providing a first supply voltage;
   providing a second supply voltage;
   providing a first modified full-rail differential logic circuit by the method of:
     providing a first modified full-rail differential logic circuit out terminal;
     providing a first modified full-rail differential logic circuit outBar terminal;
     providing a first modified full-rail differential logic circuit first node;
     coupling said first modified full-rail differential logic circuit first node to said first supply voltage;
     providing a first transistor, said first transistor comprising a first transistor first flow electrode, a first transistor second flow electrode and a first transistor control electrode;
     coupling said first modified full-rail differential logic circuit first node to said first transistor first flow electrode;
     coupling said first transistor second flow electrode to said first modified full-rail differential logic circuit out terminal;
     providing a second transistor, said second transistor comprising a second transistor first flow electrode, a second transistor second flow electrode and a second transistor control electrode;
     coupling said first modified full-rail differential logic circuit first node to said second transistor first flow electrode;
     coupling said second transistor second flow electrode to said first modified full-rail differential logic circuit outBar terminal;
     providing a third transistor, said third transistor comprising a third transistor first flow electrode, a third transistor second flow electrode and a third transistor control electrode;
     coupling said first transistor control electrode to said third transistor first flow electrode and said first modified full-rail differential logic circuit outBar terminal;
     coupling said second transistor control electrode to said third transistor second flow electrode and said first modified full-rail differential logic circuit out terminal;
     providing a fourth transistor, said fourth transistor comprising a fourth transistor first flow electrode, a fourth transistor second flow electrode and a fourth transistor control electrode;
     coupling said fourth transistor first flow electrode to said first modified full-rail differential logic circuit first node;
     coupling said fourth transistor second flow electrode to said first modified full-rail differential logic circuit out terminal;
     providing a first clock signal;
     coupling said fourth transistor control electrode to said first clock signal;
     providing a fifth transistor, said fifth transistor comprising a fifth transistor first flow electrode, a fifth transistor second flow electrode and a fifth transistor control electrode;
     coupling said fifth transistor first flow electrode to said first modified full-rail differential logic circuit first node;
     coupling said fifth transistor second flow electrode to said first modified full-rail differential logic circuit outBar terminal;
     coupling said fifth transistor control electrode to said first clock signal;
     providing a second clock signal;
     coupling a first modified full-rail differential logic circuit sense amplifier circuit between said first modified full-rail differential logic circuit out terminal and said first modified full-rail differential logic circuit outBar terminal, said first modified full-rail differential logic circuit sense amplifier circuit having an input terminal coupled to said second clock signal;

providing a logic block, said logic block comprising: at least one logic block input terminal; a logic block out terminal; and a logic block outBar terminal;

coupling said logic block out terminal to said first modified full-rail differential logic circuit out terminal;

coupling said logic block outBar terminal to said first modified full-rail differential logic circuit outBar terminal;

providing a second modified full-rail differential logic circuit by the method of:

providing a second modified full-rail differential logic circuit out terminal;

providing a second modified full-rail differential logic circuit outBar terminal;

providing a second modified full-rail differential logic circuit first node;

coupling said second modified full-rail differential logic circuit first node to said first supply voltage;

providing a first transistor, said first transistor comprising a first transistor first flow electrode, a first transistor second flow electrode and a first transistor control electrode;

coupling said second modified full-rail differential logic circuit first node to said first transistor first flow electrode;

coupling said first transistor second flow electrode to said second modified full-rail differential logic circuit out terminal;

providing a second transistor, said second transistor comprising a second transistor first flow electrode, a second transistor second flow electrode and a second transistor control electrode;

coupling said second modified full-rail differential logic circuit first node to said second transistor first flow electrode;

coupling said second transistor second flow electrode to said second modified full-rail differential logic circuit outBar terminal;

providing a third transistor, said third transistor comprising a third transistor first flow electrode, a third transistor second flow electrode and a third transistor control electrode;

coupling said first transistor control electrode to said third transistor first flow electrode and said second modified full-rail differential logic circuit outBar terminal;

coupling said second transistor control electrode to said third transistor second flow electrode and said second modified full-rail differential logic circuit out terminal;

providing a fourth transistor, said fourth transistor comprising a fourth transistor first flow electrode, a fourth transistor second flow electrode and a fourth transistor control electrode;

coupling said fourth transistor first flow electrode to said second modified full-rail differential logic circuit first node;

coupling said fourth transistor second flow electrode to said second modified full-rail differential logic circuit out terminal;

coupling said fourth transistor control electrode to said second clock signal;

providing a fifth transistor, said fifth transistor comprising a fifth transistor first flow electrode, a fifth transistor second flow electrode and a fifth transistor control electrode;

coupling said fifth transistor first flow electrode to said second modified full-rail differential logic circuit first node;

coupling said fifth transistor second flow electrode to said second modified full-rail differential logic circuit outBar terminal;

coupling said fifth transistor control electrode to said second clock signal;

providing a third clock signal;

coupling a second modified full-rail differential logic circuit sense amplifier circuit between said second modified full-rail differential logic circuit out terminal and said second modified full-rail differential logic circuit outBar terminal, said second modified full-rail differential logic circuit sense amplifier circuit having an input terminal;

coupling said second modified full-rail differential logic circuit sense amplifier circuit input terminal to said third clock signal;

providing a logic block, said logic block comprising: at least one logic block input terminal; a logic block out terminal; and a logic block outBar terminal;

coupling said logic block out terminal to said second modified full-rail differential logic circuit out terminal;

coupling said logic block outBar terminal to said second modified full-rail differential logic circuit outBar terminal;

delaying said second clock signal with respect to said first clock signal by a predetermined delay time; and delaying said third clock signal with respect to said second clock signal by a predetermined delay time.

2. The method of claim 1, wherein;

said first modified full-rail differential logic circuit sense amplifier circuit comprises:

providing a first modified full-rail differential logic circuit second node;

providing a sixth transistor, said sixth transistor comprising a sixth transistor first flow electrode, a sixth transistor second flow electrode and a sixth transistor control electrode;

coupling said first transistor second flow electrode to said sixth transistor first flow electrode;

coupling said sixth transistor second flow electrode to said first modified full-rail differential logic circuit second node;

coupling said sixth transistor control electrode to said third transistor first flow electrode and said first modified full-rail differential logic circuit outBar terminal;

providing a seventh transistor, said seventh transistor comprising a seventh transistor first flow electrode, a seventh transistor second flow electrode and a seventh transistor control electrode;

coupling said second transistor second flow electrode to said seventh transistor first flow electrode;

coupling said seventh transistor second flow electrode to said first modified full-rail differential logic circuit second node;

coupling said seventh transistor control electrode to said third transistor second flow electrode and said first modified full-rail differential logic circuit out terminal;

providing an eighth transistor, said eighth transistor comprising an eighth transistor first flow electrode, an eighth transistor second flow electrode and an eighth transistor control electrode;

coupling said eighth transistor first flow electrode to said first modified full-rail differential logic circuit second node;

coupling said eighth transistor second flow electrode to said second supply voltage;

coupling said eighth transistor control electrode to receive said second clock signal, further wherein;

said second modified full-rail differential logic circuit sense amplifier circuit comprises:

providing a first modified full-rail differential logic circuit second node;

providing a sixth transistor, said sixth transistor comprising a sixth transistor first flow electrode, a sixth transistor second flow electrode and a sixth transistor control electrode;

coupling said first transistor second flow electrode to said sixth transistor first flow electrode;

coupling said sixth transistor second flow electrode to said second modified full-rail differential logic circuit second node;

coupling said sixth transistor control electrode to said third transistor first flow electrode and said second modified full-rail differential logic circuit outBar terminal;

providing a seventh transistor, said seventh transistor comprising a seventh transistor first flow electrode, a seventh transistor second flow electrode and a seventh transistor control electrode;

coupling said second transistor second flow electrode to said seventh transistor first flow electrode;

coupling said seventh transistor second flow electrode to said second modified full-rail differential logic circuit second node;

coupling said seventh transistor control electrode to said third transistor second flow electrode and said second modified full-rail differential logic circuit out terminal;

providing an eighth transistor, said eighth transistor comprising an eighth transistor first flow electrode, an eighth transistor second flow electrode and an eighth transistor control electrode;

coupling said eighth transistor first flow electrode to said second modified full-rail differential logic circuit second node;

coupling said eighth transistor second flow electrode to said second supply voltage; and coupling said eighth transistor control electrode to receive said third clock signal.

3. The method of claim 1, wherein;

said logic block of said first modified full-rail differential logic circuit and said logic block of said second modified full-rail differential logic circuit comprise differential logic.

4. The method of claim 1, wherein;

said logic block of said first modified full-rail differential logic circuit and said logic block of said second modified full-rail differential logic circuit comprise differential logic gates.

5. The method of claim 1, wherein;

said logic block of said first modified full-rail differential logic circuit and said logic block of said second modified full-rail differential logic circuit comprise NMOS pass transistor logic;

said logic block of said first modified full-rail differential logic circuit comprises at least one control variable input and at least one pass variable input; and said logic block of said second modified full-rail differential logic circuit comprises at least one control variable input and at least one pass variable input.

6. The method of claim 1, wherein;

said first supply voltage is Vdd and said second supply voltage is ground.

7. The method of claim 6, wherein;

said first transistor, said second transistor, said fourth transistor and said fifth transistor of said first modified full-rail differential logic circuit and said first transistor, said second transistor, said fourth transistor and said fifth transistor of said second modified full-rail differential logic circuit are PFETs.

8. The method of claim 7, wherein;

said third transistor, said sixth transistor, said seventh transistor and said eighth transistor of said first modified full-rail differential logic circuit and said third transistor, said sixth transistor, said seventh transistor and said eighth transistor of said second modified full-rail differential logic circuit are NFETs.

9. A method for providing a modified full-rail differential logic circuit comprising:

providing a first supply voltage;

providing a second supply voltage;

providing a modified full-rail differential logic circuit out terminal;

providing a modified full-rail differential logic circuit outBar terminal;

providing a modified full-rail differential logic circuit first node;

coupling said modified full-rail differential logic circuit first node to said first supply voltage;

providing a first transistor, said first transistor comprising a first transistor first flow electrode, a first transistor second flow electrode and a first transistor control electrode;

coupling said modified full-rail differential logic circuit first node to said first transistor first flow electrode;

coupling said first transistor second flow electrode to said modified full-rail differential logic circuit out terminal;

providing a second transistor, said second transistor comprising a second transistor first flow electrode, a second transistor second flow electrode and a second transistor control electrode;

coupling said modified full-rail differential logic circuit first node to said second transistor first flow electrode;

coupling said second transistor second flow electrode to said modified full-rail differential logic circuit outBar terminal;

providing a third transistor, said third transistor comprising a third transistor first flow electrode, a third transistor second flow electrode and a third transistor control electrode;

coupling said first transistor control electrode to said third transistor first flow electrode and said modified full-rail differential logic circuit outBar terminal;

coupling said second transistor control electrode to said third transistor second flow electrode and said modified full-rail differential logic circuit out terminal;

providing a fourth transistor, said fourth transistor comprising a fourth transistor first flow electrode, a fourth transistor second flow electrode and a fourth transistor control electrode;

coupling said fourth transistor first flow electrode to said modified full-rail differential logic circuit first node;

coupling said fourth transistor second flow electrode to said modified full-rail differential logic circuit out terminal;

providing a first clock signal;

coupling said fourth transistor control electrode to said first clock signal;

providing a fifth transistor, said fifth transistor comprising a fifth transistor first flow electrode, a fifth transistor second flow electrode and a fifth transistor control electrode;

coupling said fifth transistor first flow electrode to said modified full-rail differential logic circuit first node;

coupling said fifth transistor second flow electrode to said modified full-rail differential logic circuit outBar terminal;

coupling said fifth transistor control electrode to said first clock signal;

providing a second clock signal;

coupling a sense amplifier circuit between said modified full-rail differential logic circuit out terminal and said modified full-rail differential logic circuit outBar terminal, said sense amplifier circuit having an input terminal coupled to said second clock signal;

providing a logic block, said logic block comprising: at least one logic block input terminal; a logic block out terminal; and a logic block outBar terminal;

coupling said logic block out terminal to said modified full-rail differential logic circuit out terminal;

coupling said logic block outBar terminal to said modified full-rail differential logic circuit outBar terminal; and delaying said second clock signal with respect to said first clock signal by a predetermined time.

10. The method of claim 9, wherein;

said sense amplifier circuit comprises:

providing a modified full-rail differential logic circuit second node;

providing a sixth transistor, said sixth transistor comprising a sixth transistor first flow electrode, a sixth transistor second flow electrode and a sixth transistor control electrode;

coupling said first transistor second flow electrode to said sixth transistor first flow electrode;

coupling said sixth transistor second flow electrode to said modified full-rail differential logic circuit second node;

coupling said sixth transistor control electrode to said third transistor first flow electrode and said modified full-rail differential logic circuit outBar terminal;

providing a seventh transistor, said seventh transistor comprising a seventh transistor first flow electrode, a seventh transistor second flow electrode and a seventh transistor control electrode;

coupling said second transistor second flow electrode to said seventh transistor first flow electrode;

coupling said seventh transistor second flow electrode to said modified full-rail differential logic circuit second node;

coupling said seventh transistor control electrode to said third transistor second flow electrode and said modified full-rail differential logic circuit out terminal;

providing an eighth transistor, said eighth transistor comprising an eighth transistor first flow electrode, an eighth transistor second flow electrode and an eighth transistor control electrode;

coupling said eighth transistor first flow electrode to said modified full-rail differential logic circuit second node;

coupling said eighth transistor second flow electrode to said second supply voltage;

coupling said eighth transistor control electrode to receive said second clock signal.

11. The method of claim 10, wherein;

said logic block of said modified full-rail differential logic circuit comprises differential logic.

12. The method of claim 10, wherein;

said logic block of said modified full-rail differential logic circuit comprises differential logic gates.

13. The method of claim 10, wherein;

said logic block of said modified full-rail differential logic circuit comprises NMOS pass transistor logic; and said logic block of said modified full-rail differential logic circuit includes at least one control variable input and at least one pass variable input.

14. The method of claim 10, wherein;

said first supply voltage is Vdd and said second supply voltage is ground.

15. The method of claim 14, wherein;

said first transistor, said second transistor, said fourth transistor and said fifth transistor are PFETs.

16. The method of claim 15, wherein;

said third transistor, said sixth transistor, said seventh transistor and said eighth transistor are NFETs.

* * * * *